United States Patent
Bui et al.

(10) Patent No.: US 8,368,449 B1
(45) Date of Patent: Feb. 5, 2013

(54) DEAD ZONE DETECTION FOR PHASE ADJUSTMENT

(75) Inventors: John Bui, Sunnyvale, CA (US); Chiakang Sung, Milpitas, CA (US); Khai Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 30 days.

(21) Appl. No.: 13/179,495

(22) Filed: Jul. 9, 2011

(51) Int. Cl.
*H03H 11/16* (2006.01)
*H03L 7/00* (2006.01)

(52) U.S. Cl. ......... 327/231; 327/146; 327/155; 327/244

(58) Field of Classification Search .................. 327/144, 327/146, 155, 231, 233–237, 241–245, 298
See application file for complete search history.

(56) References Cited

U.S. PATENT DOCUMENTS

| 7,409,031 | B1* | 8/2008 | Lee et al. ............... 375/376 |
| 7,453,968 | B2 | 11/2008 | Chang et al. |
| 7,644,296 | B1 | 1/2010 | Burney |
| 8,120,407 | B1* | 2/2012 | Ooi et al. ............... 327/241 |
| 8,149,038 | B1* | 4/2012 | Sung et al. .............. 327/231 |

\* cited by examiner

*Primary Examiner* — Patrick O'Neill
(74) *Attorney, Agent, or Firm* — Steven J. Cahill

(57) ABSTRACT

A circuit includes a phase adjustment circuit and a dead zone detect circuit. The phase adjustment circuit is operable to receive periodic signals and is operable to provide one of the periodic signals as a selected periodic signal based on a phase comparison between a data signal and the selected periodic signal. Each of the periodic signals has a different phase. The dead zone detect circuit is operable to cause the phase adjustment circuit to shift a phase of the selected periodic signal if the dead zone detect circuit determines that the data signal is in a dead zone. The dead zone detect circuit defines the dead zone based on two of the periodic signals. The phase adjustment circuit is operable to adjust a phase range of the dead zone.

20 Claims, 7 Drawing Sheets

DEAD ZONE DETECTION FOR PHASE ADJUSTMENT

TECHNICAL FIELD

The present invention relates to electronic circuits, and more particularly, to dead zone detection for phase adjustment of a periodic signal.

BACKGROUND

Many high-speed field programmable gate array (FPGA) integrated circuits contain dynamic phase alignment (DPA) circuits. Some DPA circuits produce several candidate clock signals, all of which have the same frequency (related to the frequency of an input data signal received from outside the FPGA), and each of which has a unique phase. For example, there may be eight candidate clock signals, the phases of which are equally spaced over one clock signal cycle.

Phase detector circuitry compares the phase of transitions in the input data signal to the phase of transitions in one of the candidate clock signals. Assuming the phase detector does not detect a perfect phase match, the phase detector circuitry keeps moving from one candidate clock signal to the next trying to find the candidate clock signal having the phase that will be best for use in timing the sampling of the input data signal.

DPA circuits have dead zones. During the initial calibration, a DPA circuit may be unable to select a clock signal phase in the center of the sampling window of the input data signal if the initial clock signal phase falls within the dead zone.

A delay circuit can be inserted into the data path of the input data signal to move the input data signal outside the dead zone of the DPA circuit. However, the delay of the delay circuit varies based on variations in the process of the FPGA, the supply voltage provided to the delay circuit, the temperature of the FPGA, and the frequency of the input data signal. Variations in the delay of the delay circuit may cause the clock signal phase selected by the DPA circuit to remain in the dead zone. Also, the delay circuit in the data path of the input data signal may negatively affect the performance of other circuitry in the FPGA that is responsive to the input data signal.

BRIEF SUMMARY

According to some embodiments, a circuit includes a phase adjustment circuit and a dead zone detect circuit. The phase adjustment circuit is operable to receive periodic signals and is operable to provide one of the periodic signals as a selected periodic signal based on a phase comparison between a data signal and the selected periodic signal. Each of the periodic signals has a different phase. The dead zone detect circuit is operable to cause the phase adjustment circuit to shift a phase of the selected periodic signal if the dead zone detect circuit determines that the data signal is in a dead zone. The dead zone detect circuit defines the dead zone based on two of the periodic signals. The phase adjustment circuit is operable to adjust a phase range of the dead zone.

Various objects, features, and advantages of the present invention will become apparent upon consideration of the following detailed description and the accompanying drawings.

DETAILED DESCRIPTION

Figure 1:
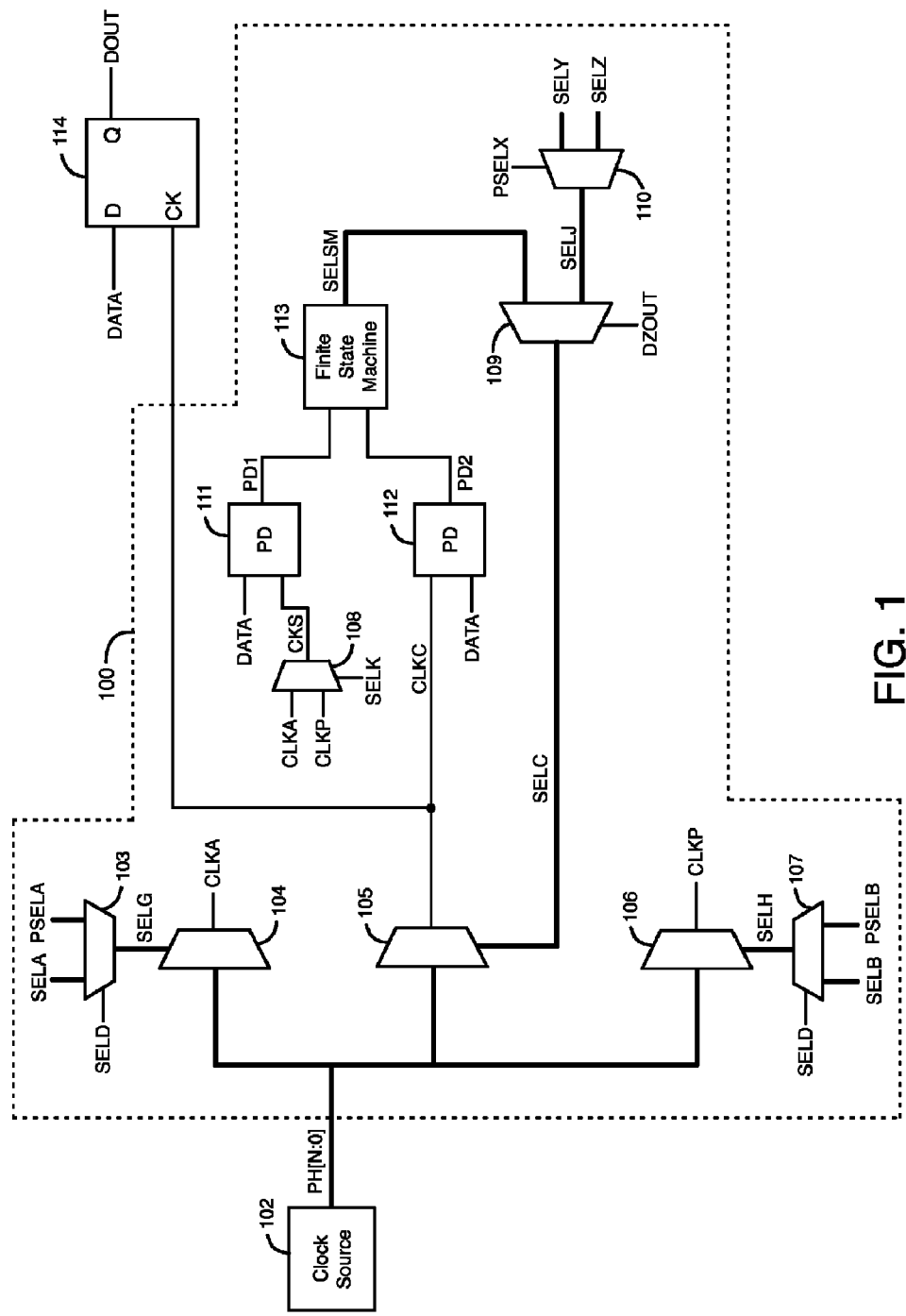
FIG. 1 illustrates an example of a phase adjustment circuit, according to an embodiment of the present invention.

FIG. 1 illustrates an example of a phase adjustment circuit 100, according to an embodiment of the present invention. Phase adjustment circuit 100 has a dead zone that is defined by the phases of two periodic clock signals CLKA and CLKP. If a selected periodic clock signal CLKC falls within the dead zone, phase adjustment circuit 100 shifts the phase of clock signal CLKC out of the dead zone in response to a dead zone detect signal DZOUT. Phase adjustment circuit 100 shifts the phase of the clock signal CLKC closer to the centers of the sampling windows of an input data signal DATA. Phase adjustment circuit 100 allows a register circuit 114 to accurately sample the input data signal DATA in response to clock signal CLKC. Clock signal CLKC may also be provided to other circuitry, such as a serializer/deserializer circuit that deserializes the input data signal DATA, a clock tree, a clock data recovery circuit, programmable logic circuits on a field programmable gate array, etc.

Phase adjustment circuit 100 includes multiplexer circuits 103-110, phase detector (PD) circuits 111-112, and finite state machine (FSM) circuit 113. Phase adjustment circuit 100 functions as a dead zone escape circuit. FIG. 1 also illustrates a clock source circuit 102 and register circuit 114. Clock source circuit 102 may be, for example, a phase-locked loop circuit or a delay-locked loop circuit. Register circuit 114 is a flip-flop circuit.

Figure 2:
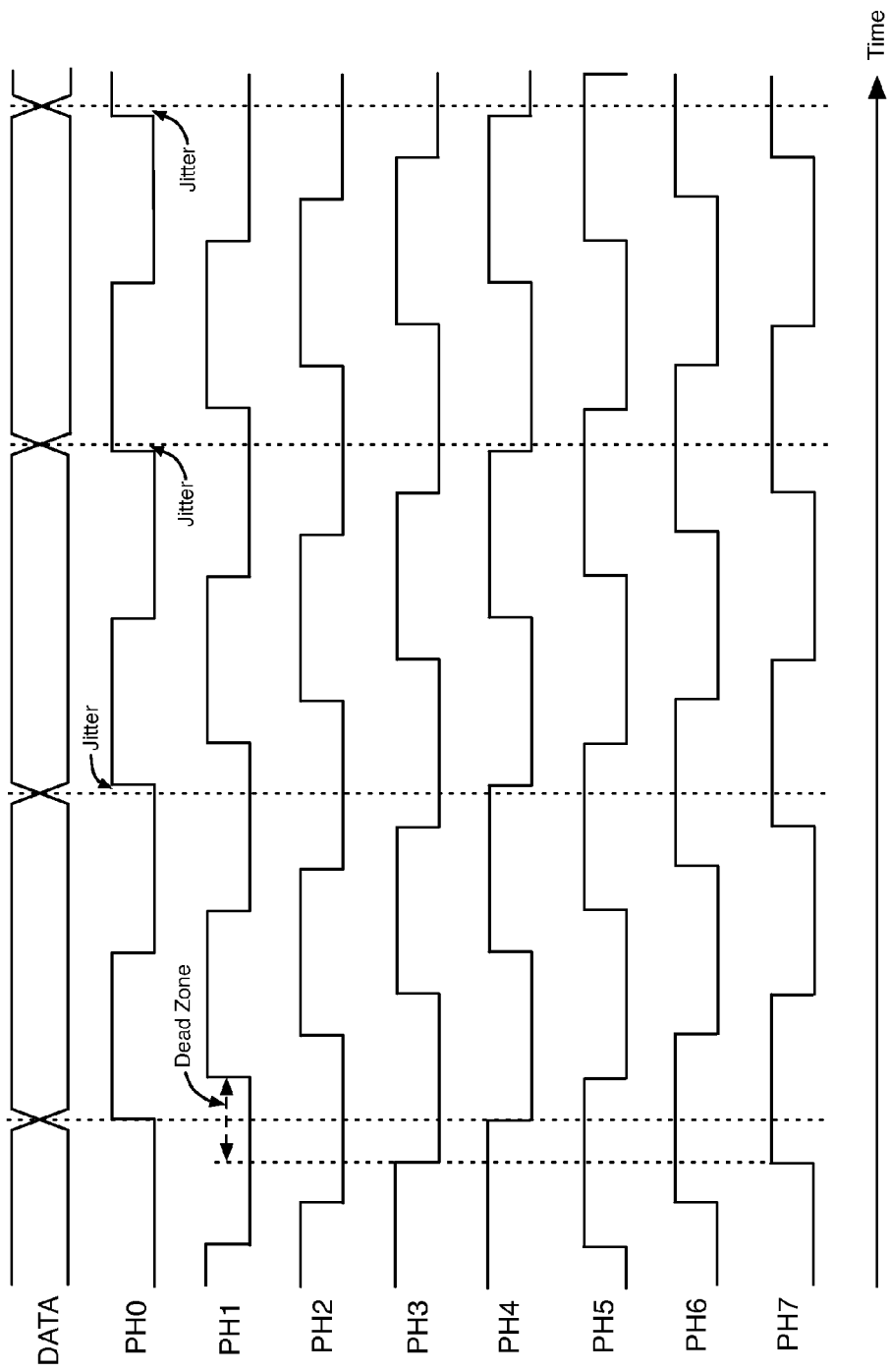
FIG. 2 is a timing diagram that illustrates exemplary waveforms for clock signals generated by the clock source circuit of FIG. 1, according to an embodiment of the present invention.

Clock source circuit 102 generates an N+1 number of periodic clock signals PH[N:0] numbered 0 through N that are offset in phase from each other at equal phase intervals over one period of each of the clock signals. As an example, clock source circuit 102 may generate 8 periodic clock signals PH0, PH1, PH2, PH3, PH4, PH5, PH6, and PH7 (i.e., PH[7:0]). FIG. 2 is a timing diagram that illustrates waveforms for 8 clock signals PH0, PH1, PH2, PH3, PH4, PH5, PH6, and PH7 generated by clock source circuit 102, according to an embodiment of the present invention. The 8 clock signals are offset in phase from each other at 45° phase intervals. Clock signals PH0, PH1, PH2, PH3, PH4, PH5, PH6, and PH7 have relative phases of 0°, 45°, 90°, 135°, 180°, 225°, 270°, and 315°, respectively, as shown in FIG. 2. FIG. 2 also illustrates an example waveform for the input data signal DATA.

Clock signals PH[N:0] are provided to the multiplexing inputs of each of multiplexer circuits 104-106. Each of multiplexer circuits 104-106 has an N number of multiplexing inputs to receive the N number of clock signals PH[N:0]. Multiplexer circuit 104 provides one of clock signals PH[N:

0] to its output as clock signal CLKA based on the logic states of select signals SELG. Multiplexer circuit 103 provides the logic states of select signals PSELA or the logic states of select signals SELA to its outputs as select signals SELG based on the logic state of select signal SELD. Multiplexer circuit 105 provides one of clock signals PH[N:0] to its output as clock signal CLKC based on the logic states of select signals SELC. Multiplexer circuit 106 provides one of clock signals PH[N:0] to its output as clock signal CLKP based on the logic states of select signals SELH. Multiplexer circuit 107 provides the logic states of select signals SELB or the logic states of select signals PSELB to its outputs as select signals SELH based on the logic state of select signal SELD.

Clock signals CLKA and CLKP are provided to multiplexing inputs of multiplexer circuit 108. Multiplexer circuit 108 provides one of clock signals CLKA or CLKP to its output as clock signal CKS based on the logic state of select signal SELK. Clock signal CKS is provided to a first input of phase detector circuit 111. The input data signal DATA is provided to a second input of phase detector circuit 111. Phase detector circuit 111 compares the phase of the clock signal CKS to the phase of the input data signal DATA to generate a first phase detect signal PD1. Phase detector circuit 111 sets the logic state of the phase detect signal PD1 based on the logic state of the input data signal DATA at each rising edge of clock signal CKS. Phase detector circuit 111 may be, for example, a D-flip-flop circuit. Phase detect signal PD1 is provided to a first input of finite state machine 113.

Clock signal CLKC is provided to a first input of phase detector circuit 112. The input data signal DATA signal is provided to a second input of phase detector circuit 112. Phase detector circuit 112 compares the phase of the clock signal CLKC to the phase of the input data signal DATA to generate a second phase detect signal PD2. Phase detector circuit 112 sets the logic state of the phase detect signal PD2 based on the logic state of the input data signal DATA at each rising edge of clock signal CLKC. Phase detector circuit 112 may be, for example, a D flip-flop circuit. Phase detect signal PD2 is provided to a second input of finite state machine 113.

Finite state machine 113 generates select signals SELSM based on the phase detect signals PD1 and PD2. Select signals SELSM are provided to a first set of multiplexing inputs of multiplexer circuit 109. The dead zone detect signal DZOUT is provided to a select input of multiplexer circuit 109. If the dead zone detect signal DZOUT indicates that circuit 100 is not in the dead zone (e.g., signal DZOUT is in a logic low state), then multiplexer circuit 109 provides the select signals SELSM to its outputs as select signals SELC. Select signals SELC are provided to the select inputs of multiplexer circuit 105.

If the transitions in the input data signal DATA occur between the rising edges of clock signals CLKC and CKS, phase detector circuits 111-112 cause the phase detect signals PD1 and PD2 to be in different logic states. Finite state machine 113 determines if the transitions in the input data signal DATA occur between the rising edges of clock signals CLKC and CKS based on the phase detect signals PD1 and PD2. If the transitions in the input data signal DATA do not occur between the rising edges of clock signals CLKC and CKS, finite state machine 113 adjusts select signals SELSM to cause multiplexer circuit 105 to select the next phase for clock signal CLKC. If circuit 100 is not in the dead zone, multiplexer circuit 109 provides the adjusted select signals SELSM to the select inputs of multiplexer circuit 105 as select signals SELC, causing multiplexer circuit 105 to adjust the phase of clock signal CLKC by selecting the clock signal from clock signals PH[N:0] having the next phase.

Finite state machine 113 then reevaluates the phase detect signals PD1 and PD2 that are generated in response to the adjusted phase of clock signal CLKC. Finite state machine 113 continues to adjust the phase of clock signal CLKC until the transitions in the input data signal DATA occur between the rising edges of clock signals CLKC and CKS. Finite state machine 113 causes multiplexer circuit 105 to cycle through clock signals PH[N:0] until the transitions in the input data signal DATA occur between the rising edges of clock signals CLKC and CKS. For example, if clock source circuit 102 generates 8 clock signals PH[N:0] having relative phases of 0°, 45°, 90°, 135°, 180°, 225°, 270°, and 315°, finite state machine 113 may cause the phase of clock signal CLKC to shift by 45° increments until the transitions in the input data signal DATA occur between the rising edges of clock signals CLKC and CKS.

In response to the transitions in the input data signal DATA occurring between the rising edges of clock signals CLKC and CKS, finite state machine 113 adjusts select signals SELSM to cause multiplexer circuit 105 to shift the phase of clock signal CLKC by a predefined phase shift. The predefined phase shift causes the rising edges of clock signal CLKC to occur in or near the centers of the sampling windows of the input data signal DATA.

In a full rate embodiment, as shown for example in FIG. 2, each bit period in the input data signal DATA approximately equals one period of each of the clock signals PH[N:0]. In a full rate embodiment, finite state machine 113 causes the phase of clock signal CLKC to shift by 180 degrees in response to detecting transitions in the input data signal DATA occurring between the rising edges of clock signals CLKC and CKS. A 180 degree phase shift can be generated by selecting a clock signal for CLKC that is 4 phases later than the previously selected clock signal CLKC as shown in FIG. 2. Shifting the phase of clock signal CLKC by 180 degrees causes the rising edges of clock signal CLKC to occur in or near the centers of the sampling windows of the input data signal DATA.

Circuit 100 is in an integrated circuit such as an FPGA. The input data signal DATA is transmitted to circuit 100 from a source that is external to the integrated circuit. As a result, the input data signal DATA typically contains jitter. After reset or start-up, circuit 100 causes multiplexer circuit 105 to select the initial phase PH0 from clock source 102 as clock signal CLKC. Jitter may cause some of the transitions in the input data signal DATA to occur before the rising edges of the selected phase PH0 for clock signal CLKC and some of the transitions in the input data signal DATA to occur after the rising edges of the selected phase PH0 for clock signal CLKC, as shown, for example, in FIG. 2. If transitions in the input data signal DATA occur before and after the rising edges of clock signal CLKC, state machine 113 may get stuck in the dead zone. When state machine 113 is in the dead zone, state machine 113 cannot generate states for select signals SELSM that shift the phase of clock signal CLKC to a phase that is at the centers of the sampling windows of the input data signal DATA.

Figure 3:
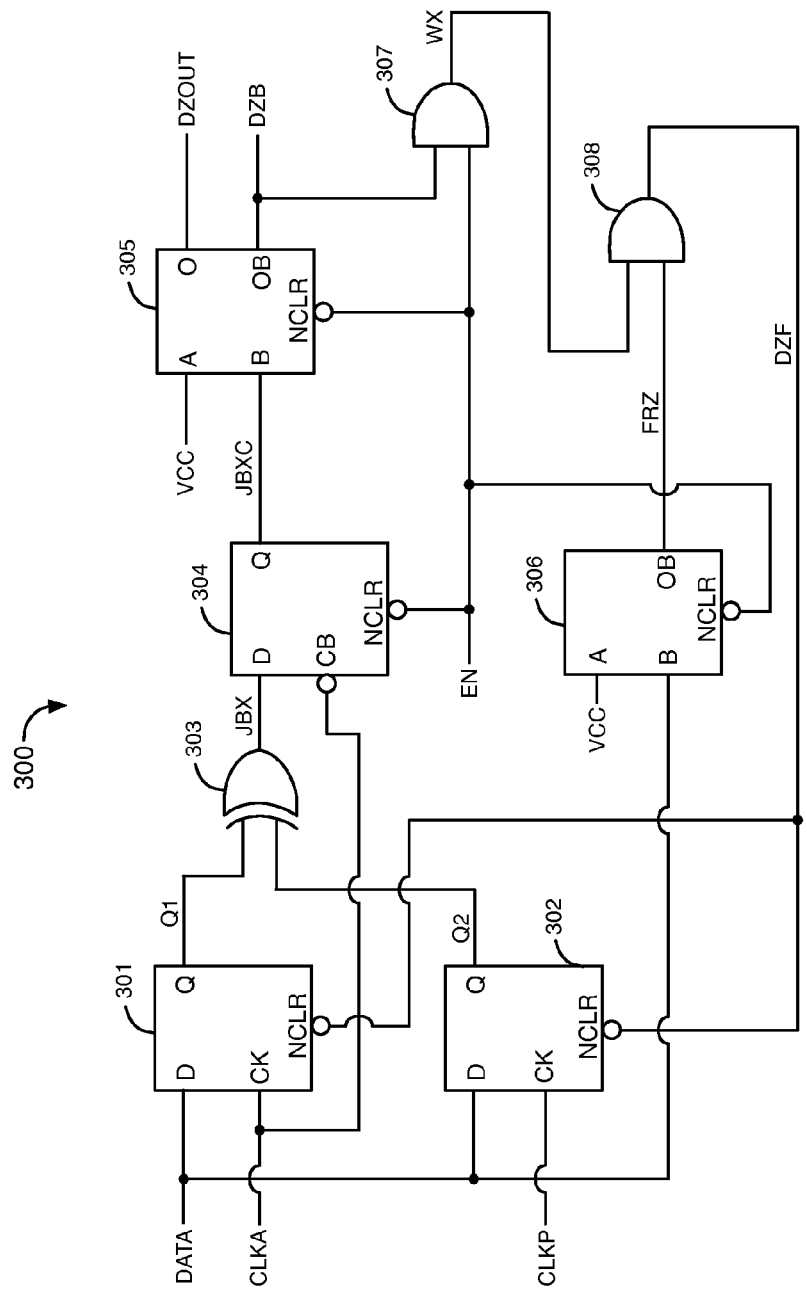
FIG. 3 illustrates an example of a dead zone detect circuit, according to an embodiment of the present invention.

FIG. 3 illustrates an example of a dead zone detect circuit 300, according to an embodiment of the present invention. Dead zone detect circuit 300 includes flip-flop circuits 301-302, logic exclusive OR (XOR) gate circuit 303, flip-flop circuit 304, logic circuit 305, logic circuit 306, and logic AND gate circuits 307-308. Flip-flop circuits 301-302 and 304 are storage circuits.

Dead zone detect circuit 300 determines if transitions in input data signal DATA occur within the dead zone of the phase adjustment circuit 100 of FIG. 1. The dead zone of the circuit 100 of FIG. 1 occurs between each rising edge of clock signal CLKP and each subsequent rising edge of clock signal CLKA. In the embodiment of FIG. 2, multiplexer circuit 104 selects clock signal PH1 as clock signal CLKA, and multiplexer circuit 106 selects clock signal PH7 as clock signal CLKP. An example of the dead zone occurring between the rising edges of clock signals PH7 and PH1 is shown in FIG. 2.

Logic circuit 305 generates the dead zone detect signal DZOUT at its O output. Logic circuit 305 generates a signal DZB at its OB output. Logic circuit 305 causes signal DZB to have a logic state that is the logical inverse of the logic state of dead zone detect signal DZOUT. Logic circuit 305 may be, for example, a shift register circuit, a counter circuit, a frequency divider circuit, or a finite state machine circuit. Logic circuit 306 generates a freeze signal FRZ at its OB output. Logic circuit 306 may be, for example, a shift register circuit, a counter circuit, a frequency divider circuit, or a finite state machine circuit.

An enable signal EN is provided to the not clear (NCLR) inputs of flip-flop circuit 304 and logic circuits 305-306. Prior to the operation of dead zone detect circuit 300, the enable signal EN is in a logic low state. Flip-circuit 304 generates a logic low state in its output signal JBXC in response to a logic low state in signal EN. Logic circuit 305 generates a logic low state in signal DZOUT and a logic high state in signal DZB in response to a logic low state in signal EN. Logic circuit 306 generates a logic high state in its output signal FRZ in response to a logic low state in signal EN.

In response to a logic low state in the enable signal EN prior to the operation of dead zone detect circuit 300, AND gate circuit 307 generates a logic low state in its output signal WX. AND gate circuit 308 generates a logic low state in its output signal DZF in response to the logic low state in the output signal WX of AND gate circuit 307. Signal DZF is provided to the not clear (NCLR) inputs of flip-flop circuits 301-302. Flip-flop circuits 301-302 generate logic low states in their output signals Q1 and Q2 in response to a logic low state in signal DZF. To begin the operation of dead zone detect circuit 300, a rising edge is generated in enable signal EN. Enable signal EN is held in a logic high state during the operation of dead zone detect circuit 300.

The input data signal DATA is provided to the D input of each of flip-flop circuits 301-302. Clock signal CLKA selected by multiplexer circuit 104 is provided to the clock (CK) input of flip-flop circuit 301 and to the clock bar (CB) input of flip-flop circuit 304. Clock signal CLKP selected by multiplexer circuit 106 is provided to the clock (CK) input of flip-flop circuit 302.

After a rising edge in signal EN, signal DZB is in a logic high state, and signal FRZ is in a logic high state. Therefore, AND gate circuit 307 generates a logic high state in signal WX, and AND gate circuit 308 generates a logic high state in signal DZF. When signal DZF is in a logic high state, flip-flop circuit 301 stores the logic state of the input data signal DATA at its Q output as signal Q1 in response to each rising edge in clock signal CLKA. When signal DZF is in a logic high state, flip-flop circuit 302 stores the logic state of input data signal DATA at its Q output as signal Q2 in response to each rising edge in clock signal CLKP.

Stored signals Q1 and Q2 are provided to the inputs of XOR gate circuit 303. XOR gate circuit 303 performs an exclusive OR (XOR) function on the stored signals Q1 and Q2 to generate signal JBX at the output of XOR gate circuit 303. In response to stored signals Q1 and Q2 both having the same logic state at the same time, XOR gate circuit 303 generates a logic low state in signal JBX. In response to stored signals Q1 and Q2 having different logic states, XOR gate circuit 303 generates a logic high state in signal JBX.

Signal JBX is provided to the D input of flip-flop circuit 304. Flip-flop circuit 304 stores the logic state of signal JBX at its Q output as signal JBXC in response to each falling edge in clock signal CLKA when signal EN is in a logic high state. Signal JBXC is provided to the B input of logic circuit 305. A supply voltage VCC is provided to the A input of logic circuit 305. Logic circuits 305-306 interpret supply voltage VCC as a signal having a logic high state.

Prior to a rising edge in signal EN that initiates the operation of circuit 300, signal DZOUT is in a logic low state, and signal DZB is in a logic high state. When signal EN is in a logic high state, logic circuits 305-306 adjust the states of their output signals in response to their input signals. After the rising edge in signal EN, logic circuit 305 generates a rising edge in dead zone detect signal DZOUT and a falling edge in signal DZB in response to a predefined integer number Y of rising edges detected in signal JBXC. The integer number Y may be, for example, 2, 3, 4, 5, 6, etc.

For example, if logic circuit 305 is a serial-in/serial-out shift register circuit having a Y number of flip-flops coupled in series, logic circuit 305 generates a rising edge in signal DZOUT and a falling edge in signal DZB in response to a Y number of rising edges received in signal JBXC. As another example, if logic circuit 305 is a counter circuit that counts up to a maximum number Y, logic circuit 305 generates a rising edge in signal DZOUT and a falling edge in signal DZB in response to a Y number of rising edges in signal JBXC. The dead zone detect signal DZOUT generated by logic circuit 305 is provided to the select input of multiplexer circuit 109 in FIG. 1.

In response to logic circuit 305 generating a falling edge in signal DZB, AND gate circuit 307 generates a falling edge in signal WX, and AND gate circuit 308 generates a falling edge in signal DZF. Flip-flop circuits 301-302 maintain their output signals Q1 and Q2 in logic low states in response to the logic low state in signal DZF. Thus, after logic circuit 305 asserts the DZOUT signal to a logic high state, circuit 300 is frozen to reduce power consumption and switching noise, such that flip-flops 301-302 no longer adjust their output signals Q1-Q2 in response to the DATA signal.

Supply voltage VCC is provided to the A input of logic circuit 306. Input data signal DATA is provided to the B input of logic circuit 306. Logic circuit 306 generates a falling edge in its output signal FRZ in response to a predefined integer number X of rising edges received in the input data signal DATA. In an embodiment, the integer number X of logic circuit 306 is greater than the integer number Y of logic circuit 305. For example, the integer number X of logic circuit 306 may equal twice the integer number Y of logic circuit 305.

If logic circuit 305 does not generate a rising edge in signal DZOUT and a falling edge in signal DZB after an X number of rising edges in the input data signal DATA, logic circuit 306 generates a falling edge in freeze signal FRZ in response to an X number of rising edges in input data signal DATA. The falling edge in signal FRZ causes AND gate 308 to generate a falling edge in signal DZF. Logic circuit 306 then maintains signal FRZ in a logic low state until a falling edge is received in the enable signal EN. Signals Q1 and Q2 remain in logic low states in response to the logic low state in signal DZF, until signal DZF returns to a logic high state. Logic circuit 305 maintains the logic state of the dead zone detect signal DZOUT constant, while signal DZF is in a logic low state.

Figure 4:
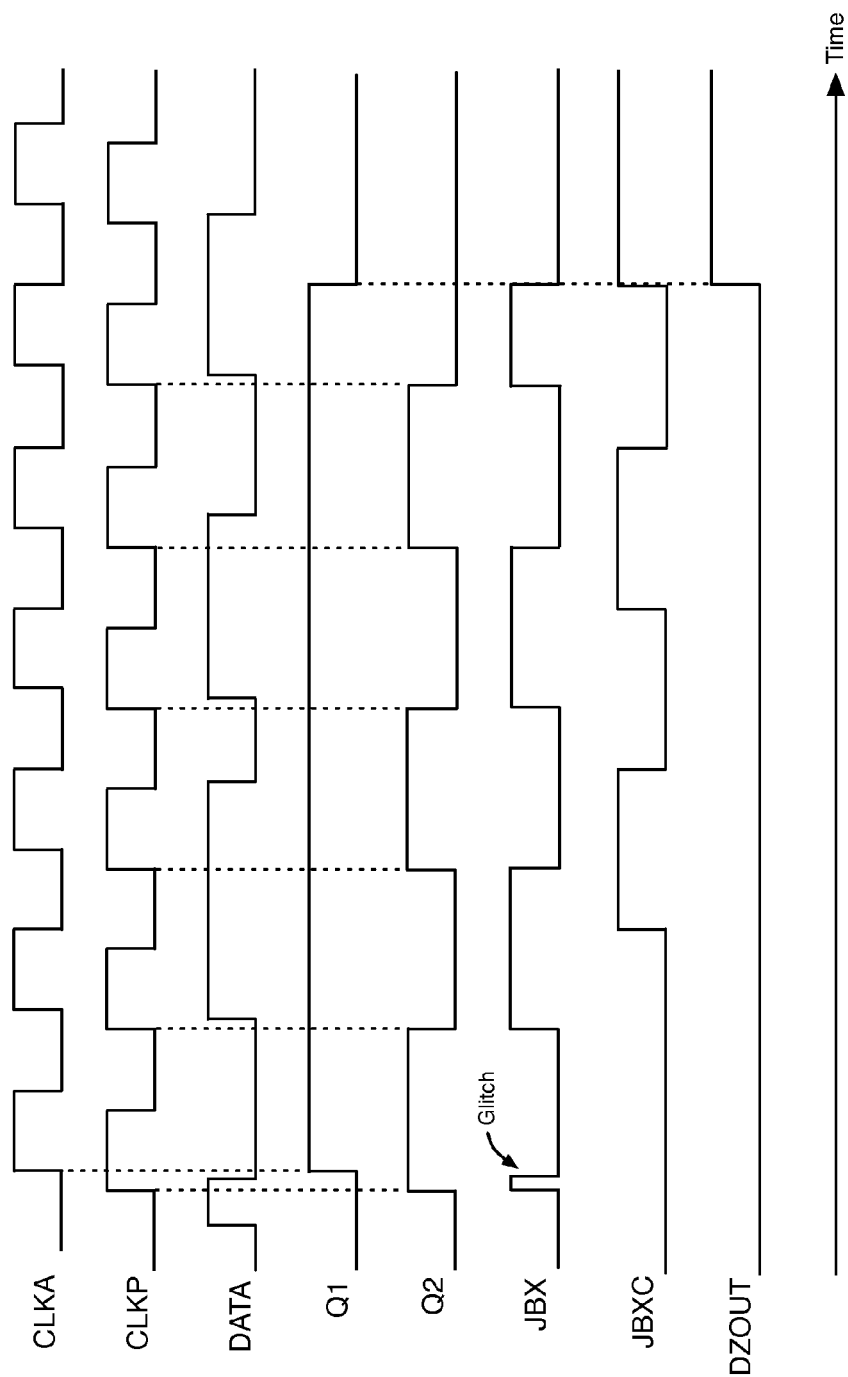
FIG. 4 is a timing diagram that illustrates exemplary waveforms for signals generated by the circuitry of FIGS. 1 and 3, according to an embodiment of the present invention.

FIG. 4 is a timing diagram that illustrates waveforms for clock signals CLKA and CLKP, the input data signal DATA, stored signals Q1-Q2, signals JBX and JBXC, and dead zone detect signal DZOUT, according to an embodiment of the present invention. In the embodiment of FIG. 4, multiplexer circuit 104 selects clock signal PH1 as clock signal CLKA, and multiplexer circuit 106 selects clock signal PH7 as clock signal CLKP. The selected clock signals PH1 and PH7 are from the full rate embodiment shown in FIG. 2. In the embodiment of FIG. 4, logic circuit 305 is a serial shift register having three serially coupled flip-flops, and logic circuit 306 is a serial shift register having six serially coupled flip-flops.

As shown in FIG. 4, XOR gate circuit 303 generates a logic high state in signal JBX in response to signals Q1 and Q2 being in different logic states. The first logic high pulse in signal JBX shown in the timing diagram of FIG. 4 is a glitch. Flip-flop circuit 304 removes the glitch in signal JBX from the waveform for signal JBXC. Flip-flop circuit 304 generates three rising edges in signal JBXC in response to the three rising edges in signal JBX that occur after the glitch. Logic circuit 305 generates a rising edge in the dead zone detect signal DZOUT in response to the third rising edge received in signal JBXC.

Referring again to FIG. 1, in response to dead zone detect circuit 300 generating a logic high state in dead zone detect signal DZOUT, multiplexer circuit 109 provides the logic states of select signals SELJ to the select inputs of multiplexer circuit 105 as select signals SELC. Selecting the logic states of select signals SELJ for select signals SELC causes multiplexer circuit 105 to shift the phase of clock signal CLKC by a predefined phase shift relative to its previous phase. Select signals SELJ are the output signals of multiplexer circuit 110. Multiplexer circuit 110 provides the logic states of select signals SELY or the logic states of select signals SELZ to its outputs as select signals SELJ based on the logic state of select signal PSELX. In an embodiment, the order of select signals SELSM is rearranged to generate select signals SELY. For example, 8 select signals SELSM[7:0] can be provided as 8 select signals SELY[3:0,7:4]. In an embodiment, the order of select signals SELSM is rearranged to generate select signals SELZ. For example, 8 select signals SELSM[7:0] can be provided as 8 select signals SELZ[4:0,7:5].

If multiplexer circuits 109-110 generate select signals SELC based on select signals SELY, multiplexer circuit 105 shifts the phase of clock signal CLKC by 135° (i.e., three 45° phase shifts) from its previous phase, in a full rate embodiment. If multiplexer circuits 109-110 generate select signals SELC based on select signals SELZ, multiplexer circuit 105 shifts the phase of clock signal CLKC by 180° (i.e., four 45° phase shifts) from its previous phase, in a full rate embodiment.

Thus, select signal PSELX determines the predefined phase shift that is provided to clock signal CLKC in response to a logic high state in the dead zone detect signal DZOUT. The phase shift provided to clock signal CLKC in response to the logic high state in signal DZOUT shifts clock signal CLKC out of the dead zone of circuit 100 to cause the rising edges of clock signal CLKC to occur closer to the centers of the sampling windows of data signal DATA. After signal DZOUT transitions to a logic high state, register circuit 114 stores an accurate value of the DATA signal at its Q output as output data signal DOUT in response to each rising edge in clock signal CLKC.

The phase range of the dead zone that is detected by dead zone detect circuit 300 can be programmed to be larger or smaller using multiplexer circuits 103 and 107. For example, the dead zone detected by dead zone detect circuit 300 is set to a larger phase range by causing multiplexer circuits 103 and 107 to provide the logic states of select signals PSELA and PSELB to the select inputs of multiplexer circuits 104 and 106 as select signals SELG and SELH, respectively. In this example, the dead zone detected by dead zone detect circuit 300 is set to a smaller phase range by causing multiplexer circuits 103 and 107 to provide the logic states of select signals SELA and SELB to the select inputs of multiplexer circuits 104 and 106 as select signals SELG and SELH, respectively. In an embodiment, the order of select signals SELSM is rearranged to generate select signals SELA. For example, 8 select signals SELSM[7:0] can be provided as 8 select signals SELA[6:0,7]. In an embodiment, the order of select signals SELSM is rearranged to generate select signals SELB. For example, 8 select signals SELSM[7:0] can be provided as 8 select signals SELB[0,7:1].

Multiplexer circuits 103 and 107 provide the logic states of select signals SELA and SELB to the select inputs of multiplexer circuits 104 and 106 as select signals SELG and SELH, respectively, if select signal SELD has a first logic state. As an example, if SELD has the first logic state, multiplexer circuit 104 selects a clock signal for CLKA that is one phase interval later than the initial phase (e.g., clock signal PH0) of clock signal CLKC, and multiplexer circuit 106 selects a clock signal for CLKP that is one phase interval earlier than the initial phase of clock signal CLKC. In the full rate embodiment of FIG. 2, multiplexer circuits 104 and 106 select the phases of clock signals PH1 and PH7 for clock signals CLKA and CLKP, respectively, in this example.

Multiplexer circuits 103 and 107 provide the states of select signals PSELA and PSELB to the select inputs of multiplexer circuits 104 and 106 as select signals SELG and SELH, respectively, if select signal SELD has a second logic state. As an example, if SELD has the second logic state, multiplexer circuit 104 selects a clock signal for CLKA that is two or more phase intervals later than the initial phase of clock signal CLKC, and multiplexer circuit 106 selects a clock signal for CLKP that is two or more phase intervals earlier than the initial phase of clock signal CLKC. In an embodiment, the order of select signals SELSM is rearranged to generate select signals PSELA. For example, 8 select signals SELSM[7:0] can be provided as 8 select signals PSELA[5:0,7:6]. In an embodiment, the order of select signals SELSM is rearranged to generate select signals PSELB. For example, 8 select signals SELSM[7:0] can be provided as 8 select signals PSELB[1:0,7:2].

In an embodiment, each set of the select signals SELA, PSELA, SELB and PSELB is generated from the SELSM select signals output by state machine 113. In an embodiment, each set of the select signals SELY and SELZ is generated from the SELSM select signals output by state machine 113. Select signals SELA, PSELA, SELB, PSELB, SELY, and/or SELZ may be selected from select signals SELSM to generate the phase shifts in clock signals CLKA, CLKC, and CLKP that are described above.

Figure 5:
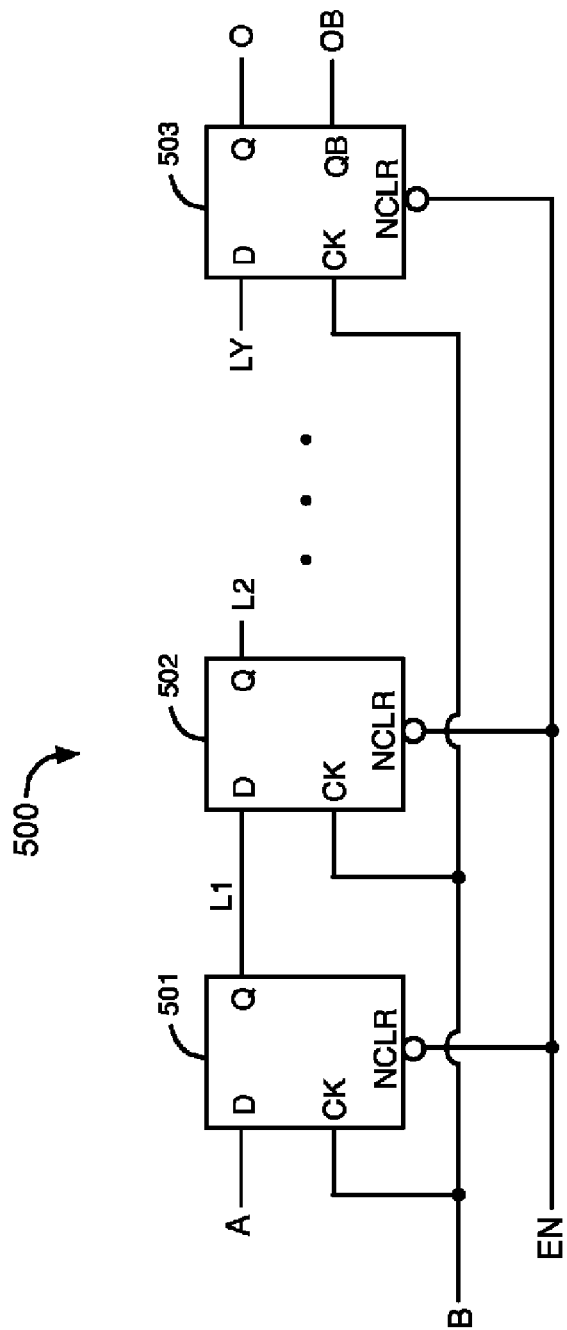
FIG. 5 illustrates an example of a serial-in/serial-out shift register circuit that can be used to implement the two logic circuits shown in FIG. 3, according to an embodiment of the present invention.

FIG. 5 illustrates an example of a serial-in/serial-out shift register circuit 500 that can be used to implement each of the logic circuits 305 and 306 shown in FIG. 3, according to an embodiment of the present invention. Shift register circuit 500 has any number (e.g., 3, 4, 5, 6, etc.) of flip-flop circuits 501, 502, 503, etc. coupled together in series. The A input of shift register circuit 500 is coupled to the D input of flip-flop circuit 501. The B input of shift register circuit 500 is coupled to the clock input CK of each of the flip-flops in shift register circuit 500. The enable signal EN is provided to the NCLR input of each of the flip-flops in shift register circuit 500. The output signal L1 generated at the Q output of flip-flop circuit 501 is provided to the D input of flip-flop circuit 502. The output signal L2 of flip-flop circuit 502 is provided to the D input of the next flip-flop circuit in the shift register 500. For example, signal L2 is provided to the D input of flip-flop circuit 503 as signal LY in a 3-flip-flop shift register embodiment. The Q output of flip-flop circuit 503 is coupled to the O output of shift register circuit 500. The QB output of flip-flop circuit 503 is coupled to the OB output of shift register circuit 500.

Figure 6:
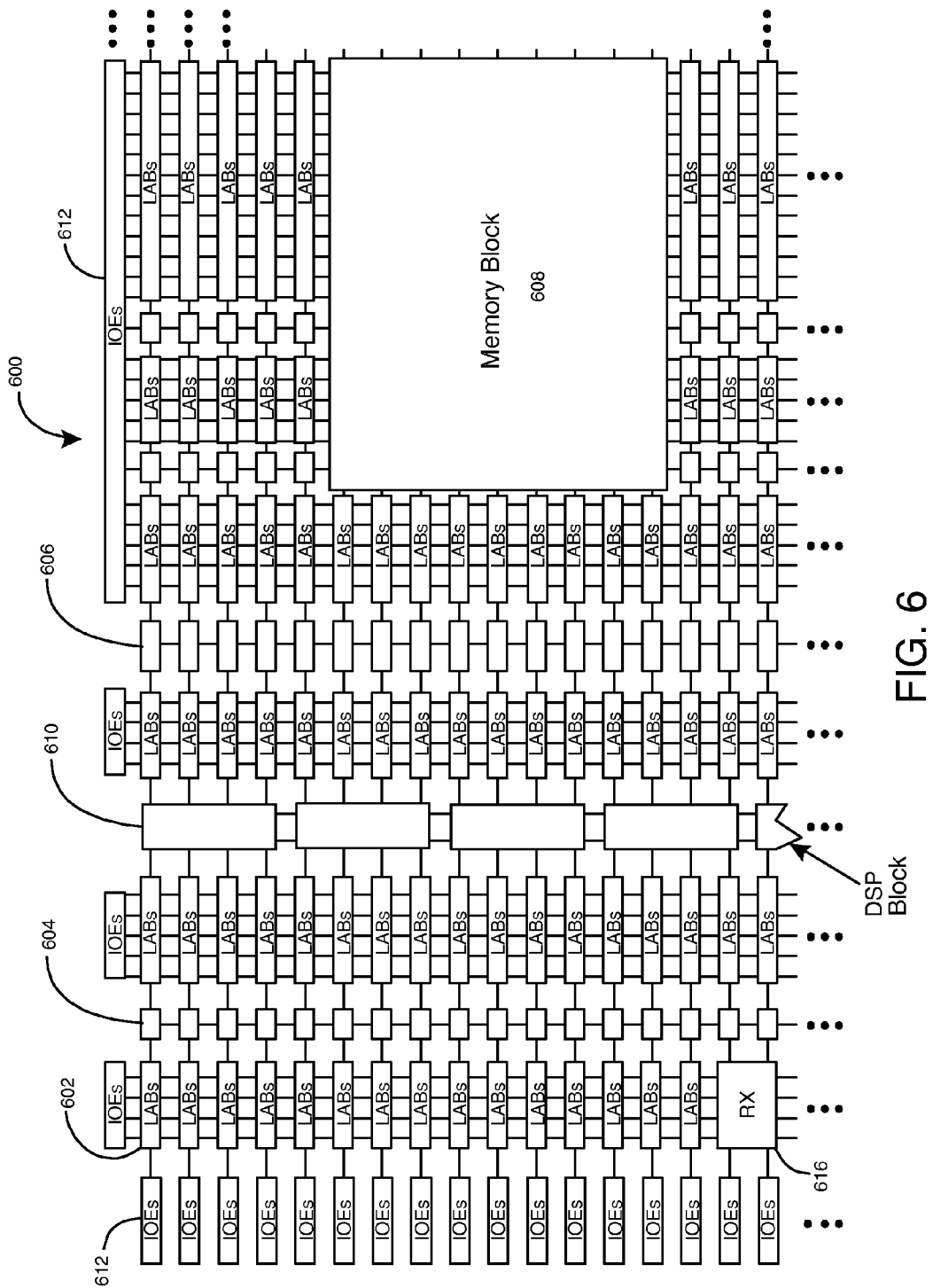
FIG. 6 is a simplified partial block diagram of a field programmable gate array (FPGA) that can include aspects of the present invention.

FIG. 6 is a simplified partial block diagram of a field programmable gate array (FPGA) 600 that can include aspects of the present invention. FPGA 600 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 600 includes a two-dimensional array of programmable logic array blocks (or LABs) 602 that are interconnected by a network of column and row interconnect conductors of varying length and speed. LABs 602 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 600 also includes a distributed memory structure including random access memory (RAM) blocks of varying sizes provided throughout the array. The RAM blocks include, for example, blocks 604, blocks 606, and block 608. These memory blocks can also include shift registers and first-in-first-out (FIFO) buffers.

FPGA 600 further includes digital signal processing (DSP) blocks 610 that can implement, for example, multipliers with add or subtract features. Input/output elements (IOEs) 612 support numerous single-ended and differential input/output standards. IOEs 612 include input and output buffers that are coupled to pins of the integrated circuit. The pins are external terminals of the FPGA die that can be used to route, for example, input signals, output signals, and supply voltages between the FPGA and one or more external devices. FPGA 600 also includes a receiver circuit (RX) 616. The circuitry shown in FIGS. 1 and 3 may be part of the receiver circuit 616. FPGA 600 is described herein for illustrative purposes. Embodiments of the present invention can be implemented in many different types of integrated circuits.

Figure 7:
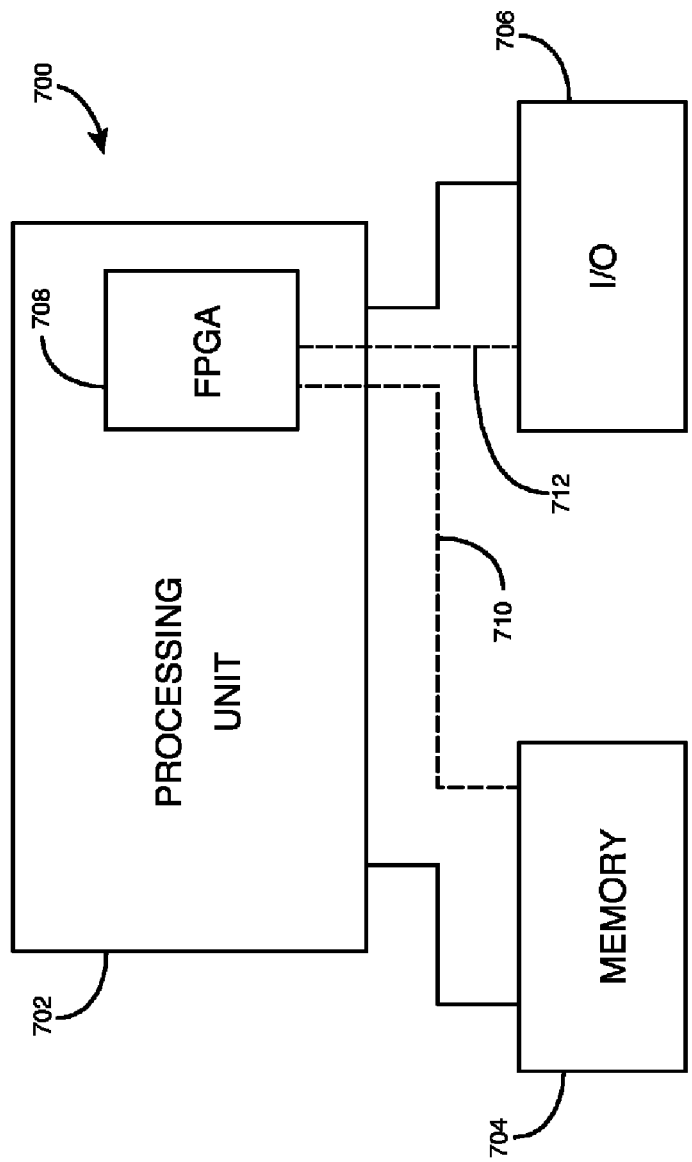
FIG. 7 shows a block diagram of an exemplary digital system that can embody techniques of the present invention.

The present invention can also be implemented in a system that has an FPGA as one of several components. FIG. 7 shows a block diagram of an exemplary digital system 700 that can embody techniques of the present invention. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704, and an input/output (I/O) unit 706 interconnected together by one or more buses. According to this exemplary embodiment, an FPGA 708 is embedded in processing unit 702. FPGA 708 can serve many different purposes within the system of FIG. 7. FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 can direct data to an appropriate system component for processing or storage, execute a program stored in memory 704, receive and transmit data via I/O unit 706, or other similar functions. Processing unit 702 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 can control the logical operations of the system. As another example, FPGA 708 acts as a reconfigurable processor that can be reprogrammed as needed to handle a particular computing task. Alternatively, FPGA 708 can itself include an embedded microprocessor. Memory unit 704 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   a phase adjustment circuit operable to receive periodic signals and operable to provide one of the periodic signals as a selected periodic signal based on a phase comparison between a data signal and the selected periodic signal, wherein each of the periodic signals has a different phase; and
   a dead zone detect circuit operable to cause the phase adjustment circuit to shift a phase of the selected periodic signal if the dead zone detect circuit determines that the data signal is in a dead zone,
   wherein the dead zone detect circuit defines the dead zone based on two of the periodic signals, and wherein the phase adjustment circuit is operable to adjust a phase range of the dead zone.

2. The circuit of claim 1, wherein the dead zone detect circuit comprises a first storage circuit operable to store a value of the data signal as a first stored signal in response to a first one of the periodic signals that define the dead zone, and a second storage circuit operable to store a value of the data signal as a second stored signal in response to a second one of the periodic signals that define the dead zone.

3. The circuit of claim 2, wherein the dead zone detect circuit further comprises an XOR logic gate circuit operable to generate a logic signal based on the first stored signal and the second stored signal.

4. The circuit of claim 3, wherein the dead zone detect circuit further comprises a third storage circuit operable to store a value of the logic signal as a third stored signal, and a logic circuit operable to generate a dead zone detect signal based on the third stored signal, and wherein the dead zone detect signal indicates to the phase adjustment circuit when the data signal is in the dead zone.

5. The circuit of claim 1, wherein the dead zone detect circuit is operable to generate a dead zone detect signal that indicates to the phase adjustment circuit when the data signal is in the dead zone, and wherein the dead zone detect circuit is operable to adjust the dead zone detect signal based on detecting a first number of transitions in the data signal occurring between phases of the two periodic signals that define the dead zone.

6. The circuit of claim 5, wherein the dead zone detect circuit comprises a first shift register circuit operable to generate the dead zone detect signal and a second shift register circuit operable to prevent the dead zone detect circuit from adjusting the dead zone detect signal in response to the data signal after a second number of transitions in the data signal.

7. The circuit of claim 1, wherein the phase adjustment circuit comprises a first multiplexer operable to select a first one of the periodic signals as the selected periodic signal, a second multiplexer operable to select a second one of the periodic signals to define the dead zone, and a third multiplexer operable to select a third one of the periodic signals to define the dead zone.

8. The circuit of claim 1, wherein the phase adjustment circuit comprises a multiplexer operable to select one of the periodic signals as the selected periodic signal, a first phase detector operable to compare the data signal to the selected periodic signal to generate a first phase detect signal, a second phase detector operable to compare the data signal to a periodic signal selected from the periodic signals to generate a second phase detect signal, and a state machine operable to control the multiplexer based on the first and the second phase detect signals.

9. The circuit of claim 1, wherein the circuit is in an integrated circuit die.

10. A circuit comprising:
a clock source circuit operable to generate periodic signals that each has a unique phase;
a phase adjustment circuit operable to select a first one of the periodic signals as a selected clock signal based on a phase comparison between a data signal and the selected clock signal; and
a dead zone detect circuit operable to cause the phase adjustment circuit to shift a phase of the selected clock signal if the data signal is in a dead zone based on detecting a first number of transitions in the data signal occurring between a phase of a second one of the periodic signals and a phase of a third one of the periodic signals,
wherein the phase adjustment circuit is operable to adjust a phase range of the dead zone based on any two of the periodic signals.

11. The circuit of claim 10, wherein the phase adjustment circuit comprises a multiplexer operable to select the first one of the periodic signals as the selected clock signal, a first phase detector operable to compare the data signal to the selected clock signal to generate a first phase detect signal, a second phase detector operable to compare the data signal to a periodic signal to generate a second phase detect signal, and a control circuit operable to control the multiplexer based on the first and the second phase detect signals.

12. The circuit of claim 10, wherein the dead zone detect circuit comprises a first storage circuit operable to store a value of the data signal as a first stored signal in response to the second one of the periodic signals, and a second storage circuit operable to store a value of the data signal as a second stored signal in response to the third one of the periodic signals, and wherein the dead zone detect circuit further comprises an XOR logic gate circuit operable to generate a logic signal based on the first stored signal and the second stored signal.

13. The circuit of claim 12, wherein the dead zone detect circuit further comprises a third storage circuit operable to store a value of the logic signal as a third stored signal, and a logic circuit operable to generate a dead zone detect signal based on the third stored signal, and wherein the dead zone detect signal indicates to the phase adjustment circuit when the data signal is in the dead zone.

14. The circuit of claim 10, wherein the dead zone detect circuit is operable to generate a dead zone detect signal that indicates to the phase adjustment circuit when the data signal is in the dead zone, and wherein the dead zone detect circuit comprises a first shift register circuit operable to generate the dead zone detect signal and a second shift register circuit operable to prevent the dead zone detect circuit from adjusting the dead zone detect signal in response to the data signal after a second number of transitions in the data signal.

15. The circuit of claim 10, wherein the phase adjustment circuit comprises a first multiplexer operable to select the first one of the periodic signals as the selected clock signal, a second multiplexer operable to select the second one of the periodic signals, and a third multiplexer operable to select the third one of the periodic signals.

16. The circuit of claim 10 further comprising:
a storage circuit operable to store a value of the data signal in response to the selected clock signal.

17. A method comprising:
providing periodic signals that each has a different phase;
selecting a first one of the periodic signals as a first selected signal based on a phase comparison between a data signal and the first selected signal;
selecting second and third ones of the periodic signals to define a dead zone, wherein a phase range of the dead zone is adjustable; and
shifting a phase of the first selected signal if a dead zone detect circuit determines that the data signal is in the dead zone.

18. The method of claim 17, wherein selecting a first of the periodic signals as a first selected signal based on a phase comparison between a data signal and the first selected signal comprises comparing a phase of the data signal to a phase of the first selected signal and to a phase of a periodic signal selected from the periodic signals to generate first and second phase detect signals, and selecting the first one of the periodic signals as the first selected signal based on the first and the second phase detect signals.

19. The method of claim 17 wherein selecting second and third ones of the periodic signals to define a dead zone further comprises:
adjusting a first select signal provided to a first multiplexer that selects the second one of the periodic signals; and
adjusting a second select signal provided to a second multiplexer that selects the third one of the periodic signals.

20. The method of claim 17, wherein the dead zone detect circuit determines that the data signal is in the dead zone based on detecting a predefined number of transitions in the data signal occurring between phases of the two periodic signals that define the dead zone.

* * * * *